(12) United States Patent
Mishra et al.

(10) Patent No.: US 7,847,717 B2
(45) Date of Patent: Dec. 7, 2010

(54) LOW NOISE CURRENT STEERING DAC

(75) Inventors: Vineet Mishra, Bangalore (IN); Samala Sreekiran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 66 days.

(21) Appl. No.: 12/416,429

(22) Filed: Apr. 1, 2009

(65) Prior Publication Data

US 2010/0253561 A1   Oct. 7, 2010

(51) Int. Cl.
  *H03M 1/66* (2006.01)
(52) U.S. Cl. .................. 341/144; 341/118; 341/120
(58) Field of Classification Search .......... 341/136, 341/144, 155, 120, 118, 150; 330/288
See application file for complete search history.

(56) References Cited

U.S. PATENT DOCUMENTS

| | | | | |
|---|---|---|---|---|
| 4,280,091 A | * | 7/1981 | Hiltner | 323/315 |
| 6,373,266 B1 | * | 4/2002 | Carelli et al. | 324/716 |
| 7,639,081 B2 | * | 12/2009 | Arakali et al. | 330/288 |
| 7,639,781 B2 | * | 12/2009 | Shampine et al. | 378/54 |
| 7,714,756 B2 | * | 5/2010 | Huang et al. | 341/136 |

* cited by examiner

*Primary Examiner*—Peguy JeanPierre
(74) *Attorney, Agent, or Firm*—Wade J. Brady, III; Frederick J. Telecky, Jr.

(57) ABSTRACT

A low noise current steering digital-to-analog converter (DAC). The DAC includes a current reference for generating a bias current that biases a set of current elements. The set of current elements includes a reference element. The current reference includes a reference amplifier and a reference arm. The reference arm includes a reference resistor and the reference element. The DAC further includes a switch periodically coupling each current element including the reference element, to the reference resistor and an output of the DAC. This rotates the set of current elements and attenuates flicker noise from each of the set of current elements.

16 Claims, 6 Drawing Sheets

LOW NOISE CURRENT STEERING DAC

TECHNICAL FIELD

Embodiments of the disclosure relate to current steering digital-to-analog (DAC) converters.

BACKGROUND

FIG. 1 illustrates an N-level current steering DAC 100 according to the prior art. The DAC 100 includes a reference arm and a set of current elements (five current elements 110, 115, 120, 125 and 130). The reference arm includes a reference amplifier 105 receiving a reference voltage and a feedback voltage, a reference resistor 135 and a reference element, for example current element 110.

Conventional DAC architectures as shown in FIG. 1 apply dynamic element matching (DEM) algorithms to whiten and reduce noise (especially flicker noise in low frequency applications) from the current elements of the DAC. In spite of the noise reduction from the current elements, output noise of the DAC is dominated by the noise from the reference arm and the reference amplifier 105, both used for generating a reference current needed for the DAC. While steering current, the noise (current noise) from the reference arm gets multiplied by a mirroring ratio of the DAC and appears at the output of the DAC. The current noise includes both thermal and flicker noise of the current elements of the DAC. To reduce the current noise, the reference current needs to be significantly increased which results in increased power consumption. Also, resistance of the reference resistor 135 needs to be reduced in order to increase the reference current. This results in increasing the current noise contribution of the reference resistor 135. The reference amplifier 105 is typically a differential-to-single-ended amplifier that can be chopped for noise reduction. However, reference resistor 135 and the reference element noise become the bottleneck in reducing output current noise of the DAC.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An exemplary embodiment provides a current steering digital-to-analog (DAC) converter. The DAC includes a current reference for generating a bias current that biases a set of current elements. The set of current elements includes a reference element. The current reference includes a reference amplifier and a reference arm. The reference arm includes a reference resistor and the reference element. The DAC further includes a switch periodically coupling each current element including the reference element, to the reference resistor and an output of the DAC. This causes rotation among the set of current elements and attenuates flicker noise from each current element.

An exemplary embodiment provides a method for reducing noise in a DAC. A bias current is generated that biases a set of current elements. The set of current elements includes a reference element. The current reference includes a reference amplifier and a reference arm. The reference arm includes a reference resistor and the reference element. Further, each current element including the reference element is periodically coupled to the reference resistor and an output of the DAC respectively. This causes rotation of the set of current elements and attenuates flicker noise from each current element.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Embodiments described herein provide system and method for reducing flicker noise in an N-level current steering digital-to-analog converter (DAC), hereinafter referred to as a DAC. One embodiment provides a DAC that shapes noise of the current elements of the DAC along with the reference element as white noise. In one embodiment the noise includes flicker noise. Another embodiment provides a rotation mechanism that rotates the current elements including the reference element of the DAC in such a way that, flicker noise created at an output of the DAC due to a particular reference element is attenuated when the particular reference element is out of the reference amplifier loop. In various embodiments, the current elements of the DAC include one or more reference elements. In various embodiments, a reference element is referred to as a current element which is in a reference amplifier loop of the DAC at least once in a rotation cycle. In various embodiments, the DAC includes a single-bit and multi-bit DAC. In various embodiments, a rotation cycle may be defined as a time period when a particular current element which is in a reference position returns to its original position.

Figure 2:
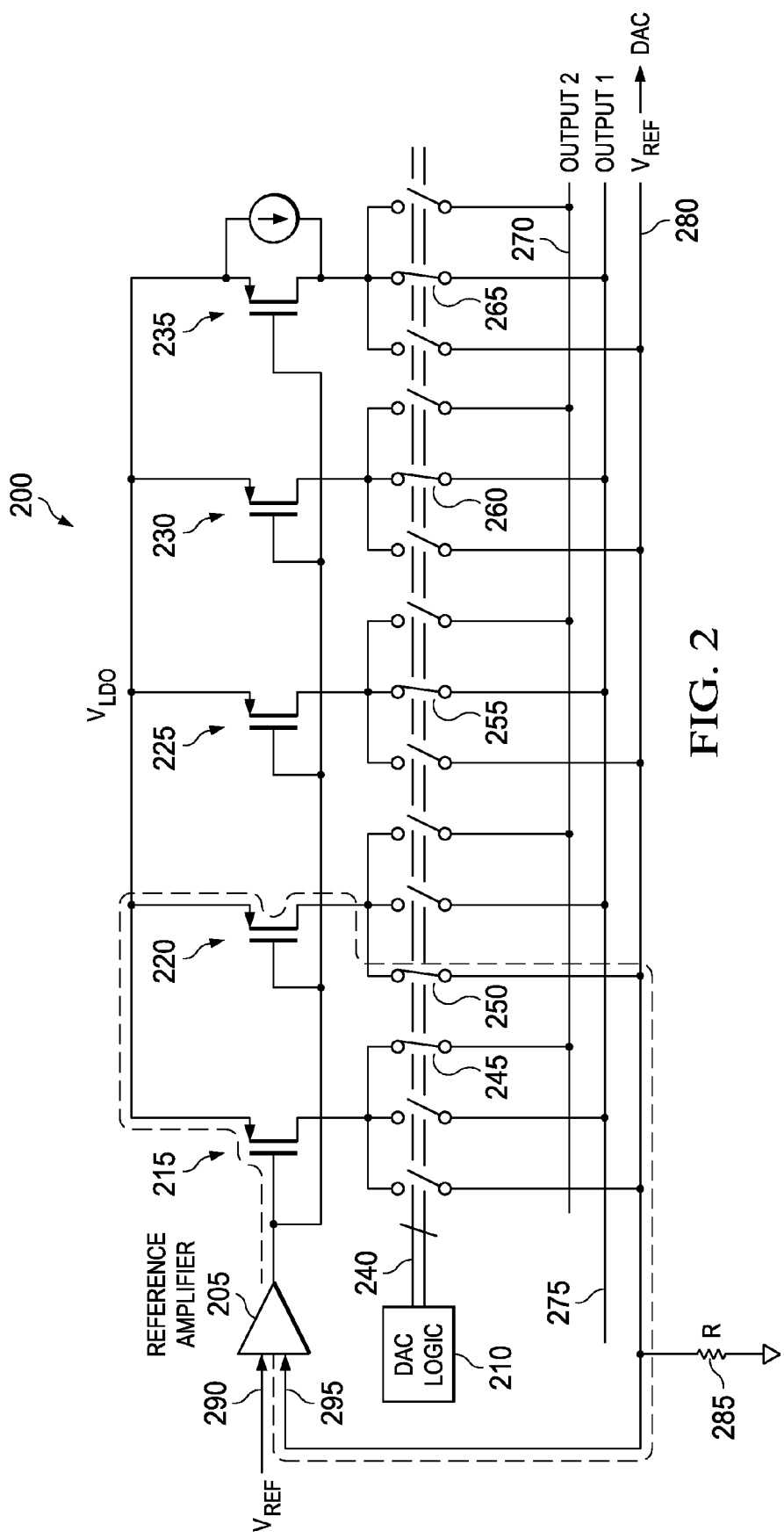
FIG. 2 illustrates a current steering DAC according to an embodiment.

FIG. 2 illustrates a DAC 200 according to an embodiment. In general, the DAC includes a reference amplifier 205, a set of current elements (215, 220, 225, 230 and 235), a set of switches (245, 250, 255, 260 and 265) connected to the current elements, a DAC logic 210, a reference resistor 285, a set of outputs (output 1, 275 and output 2, 270) and a reference voltage feedback 280. In this embodiment, the current elements (215, 220, 225, 230 and 235) include a reference element that is in a reference amplifier loop. In another embodiment the current elements include a plurality of reference elements. The reference amplifier loop is shown using dotted lines in FIG. 2. A current reference includes the reference amplifier 205 and a reference arm connected to each other. In various embodiments the reference arm includes the reference element 220 and the reference resistor 285.

Each of the current elements (215, 220, 225, 230 and 235) includes a transistor with a source connected to the voltage supply $V_{LDO}$, a drain connected to a set of switches (245, 250, 255, 260 and 265) and a gate connected to the outputs (270 and 275) of the reference amplifier 205. Each switch is connected to the drains of the transistors in such a way that each transistor is selectively connected in a periodic manner to the set of outputs of the DAC (270 and 275) and to the reference voltage feedback 280 by activating or deactivating each switch. The DAC logic 210 is connected to the set of switches (245, 250, 255, 260 and 265) using a bus control 240. FIG. 2 illustrates that the switch 250 is closed which connects current element 220 to the feedback reference voltage output 280 (DAC $V_{REF}$). Hence, current element 220 is the reference element that is in the reference amplifier loop. Other switches 245, 255, 260 and 265 connect the current elements 215, 225, 230 and 245 to output 1, 275 or output 2, 270 respectively. The feedback reference voltage output 280 is connected to the reference resistor 285 and to the reference amplifier 205 as an input (on a line 295). Another reference voltage $V_{REF}$ is supplied as another input to the reference amplifier 205 on a line 290. Operation of the DAC according to an embodiment is explained as follows.

The current reference generates a bias current that biases the set of current elements (215, 220, 225, 230 and 235). The reference voltage $V_{REF}$ and the feedback voltage DAC $V_{REF}$ supplied as inputs to the reference amplifier 205 are used to generate the bias current. There reference voltage feedback loop ensures that the voltage reference appears across the reference register creating a current Vref/R and the gate of the reference current element (s) is set by the feedback loop to supply this current. The DAC logic 210 controls the switches in such a way that each current element (215, 220, 225, 230 and 235) is in the reference amplifier loop at least once in a rotation cycle. The switch periodically connects each of the current elements including the reference element, to the reference resistor 285 and an output of the DAC, for rotating the set of current elements (205-235), thereby attenuating flicker noise from each of the current elements. In the FIG. 2 implementation, current element 220 is the reference element which is in the reference amplifier loop. Current elements 225, 230 and 235 are switched to output 1 (275) and the current element 215 is switched to output 2 (270). Considering that output 1 is positive and output 2 is negative, current elements 225, 230 and 235 are switched to positive and current element 215 is switched to negative.

As illustrated in FIG. 2, consider that one of the current elements (235 in the figure) has a noise of ΔI which can be considered as flicker noise and that the current element 235 is rotated according to this embodiment. The DAC 200 includes five switching cycles in one rotation cycle. Out of the five switching cycles, the current element 235 is switched to output 1 (275) for three switching cycles, once to output 2 (270) and once to the reference amplifier loop. Using the formulae explained below, it will be clear that the average error (flicker noise) of the current element 235 created at an output of the DAC 200 when the current element 235 is in the reference amplifier loop is zero. In other words the flicker noise from the current element 235 is attenuated due to the rotation mechanism.

As a generic example, assume that the reference amplifier bandwidth is greater than the rotation frequency (frequency at which the current elements of the DAC are rotated) and that the number of reference elements is 1. Gate voltage of the reference element 220 increases by $\Delta I/g_m$, for the 1 out of (N+1) rotation cycles, where '$g_m$' is the gain of the reference amplifier 205 and 'N' is the number of current elements of the DAC.

Hence, in 1 out of N+1 switching cycles,

Error current is $I_+ - I_- = -(N-1)\Delta I - (-\Delta I) = -(N-2)\Delta$

The average error current in 1 rotation cycle (when the noisy current element, for example current element 235, is in the reference amplifier loop)

$$= -(N-2)\Delta/(N+1) \qquad \text{Equation (1)}$$

In the remaining N out of N+1 switching cycles,

Error current is $I_+ - I_- = (N-1)\Delta I - \Delta I = (N-2)\Delta$

The average error current in 1 rotation cycle (when the noisy current element, for example current element 235, is switched to one of the outputs of the DAC (out of the reference amplifier loop))

$$= (N-2)\Delta/(N+1) \qquad \text{Equation (2)}$$

Average net error in one rotation cycle=Equation (1)+ Equation (2)=[−(N−2)Δ]+[(N−2)Δ]/(N+1)=0.

Figure 3A:
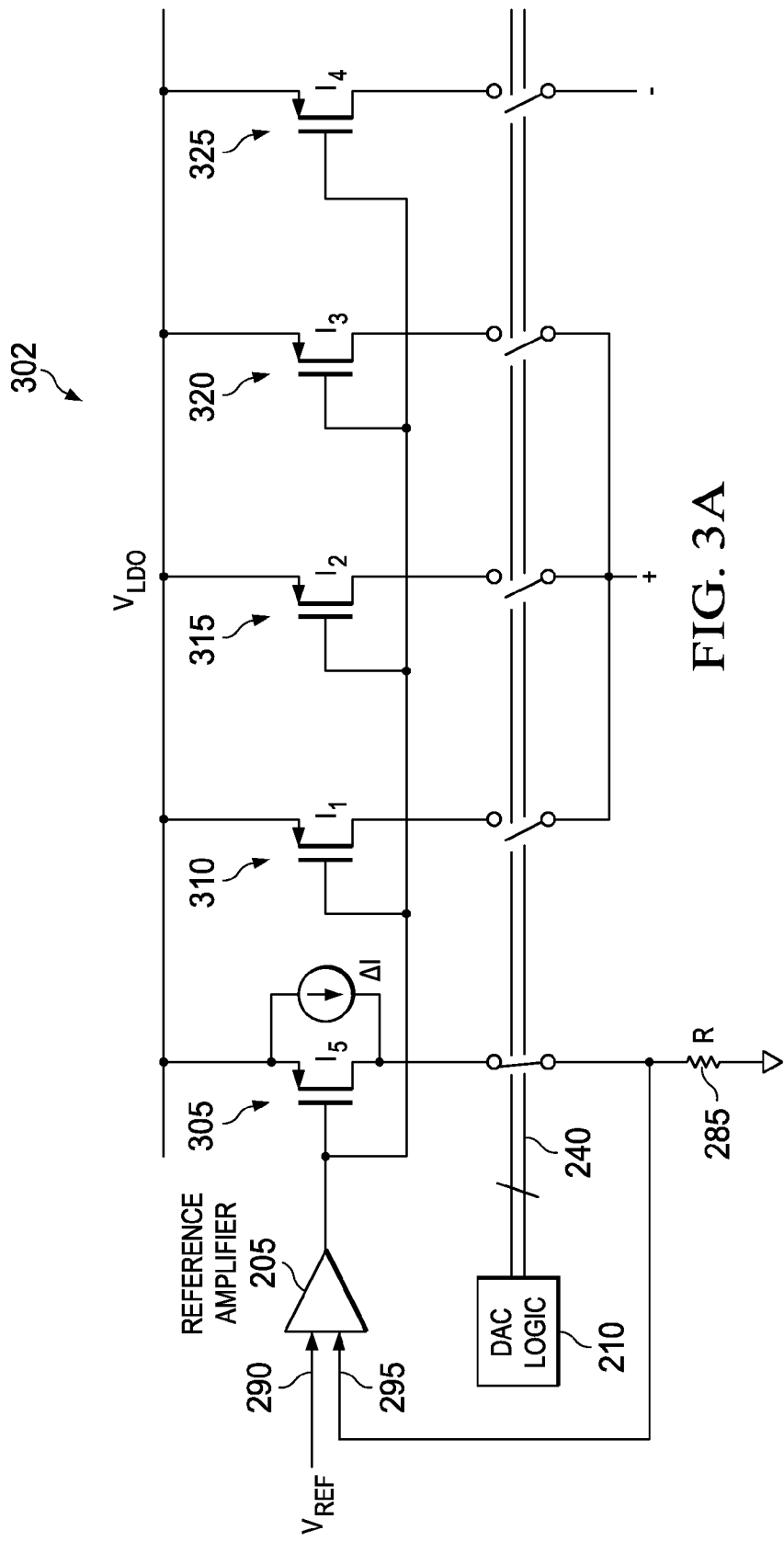
FIGS. 3A and 3B illustrate an example implementation of the rotation mechanism in the DAC according to an embodiment.
Figure 3B:
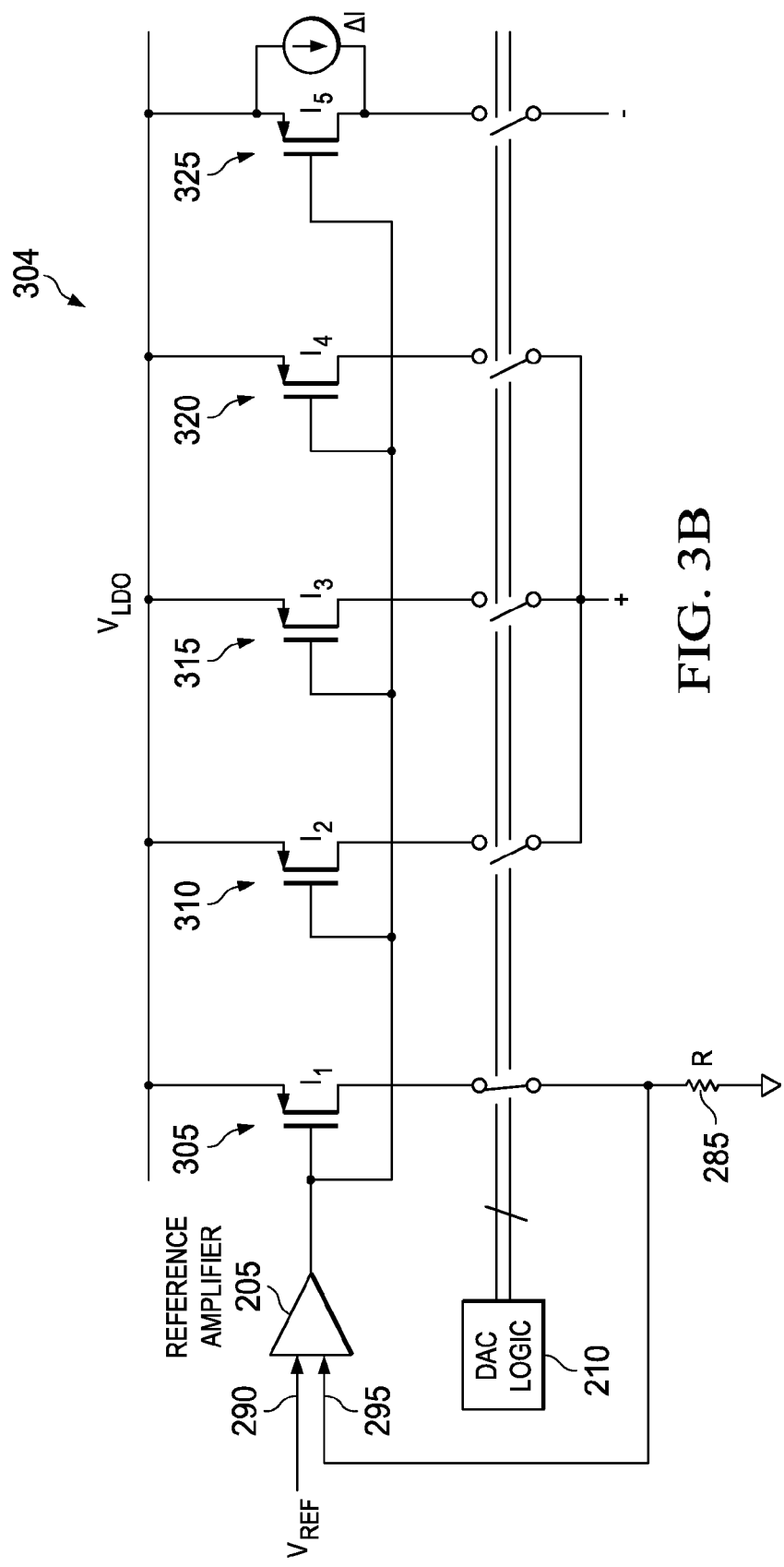

The aforementioned example and the rotation mechanism according to an embodiment is further explained in detail using a DAC as illustrated in FIG. 3A and FIG. 3B. FIG. 3A illustrates a DAC 302 with a current element $I_5$ 305 in the reference amplifier loop and FIG. 3B illustrates the DAC 304 with the current element $I_5$ 305 out of the reference amplifier loop.

Referring now to FIG. 3A, the DAC 302 includes a reference amplifier 205, five current elements ($I_5$ 305, $I_1$ 310, $I_2$ 315, $I_3$ 320 and $I_4$ 325), a DAC logic 210 and a reference resistor 285. The current elements include at least one reference element (current element 305) that is in a reference amplifier loop. A current reference includes the reference amplifier 205, the reference element (current element 305) and the reference resistor 285 connected to each other. Each of the current elements includes a transistor with a source connected to the supply voltage $V_{LDO}$, a drain connected to a set of switches (245, 250, 255, 260 and 265) and a gate connected to an output of the reference amplifier 205. Each switch is connected to the drains of the transistors in such a way that each transistor is selectively connected to the set of outputs of the DAC (not shown in FIG. 3A) and the reference voltage feedback 280.

The DAC logic 210 is connected to the set of switches using a bus control 240. As illustrated in FIG. 2, current element 305 ($I_5$) is connected to the feedback reference voltage output. Hence, current element 305 is the reference element that is in the reference amplifier loop. Three of the current elements (310, 315 and 320) are switched to a positive output and one current element (325) is switched to negative output. The feedback reference voltage is connected to the reference resistor 285 and to the reference amplifier 205 as an input (on a line 295). Another reference voltage $V_{REF}$ is supplied as another input to the reference amplifier 205 on a line 290. Operation of the DAC is explained as follows. The DAC logic controls the switch in such a way that the current element 305 ($I_5$) is in the reference amplifier loop. Each current element gets a DC offset of ΔI. The error current created when current element 305 is in the reference loop is calculated as follows.

Considering that 3 current elements are switched to positive and one current element is switched to negative output and one of the current elements which is switched to positive has a noise of ΔI, Error current=$I_+ - I_- = -\Delta I + 3\Delta I = 2\Delta I$    Equation (3)

However, the error current occurs for only one cycle out of five switching cycles.

Hence, average error current when current element 305 is in the reference amplifier loop $$= 2\Delta I/5 \qquad \text{Equation (4)}$$

Referring now to FIG. 3B, the DAC 304 illustrates the current element $I_5$ 305 outside the reference amplifier loop. DAC 304 is the same as DAC 302 in the connections which are explained above in detail with a difference in position of the current element 305. In the rotation cycle, current element 310 is now in the reference amplifier loop in the rotation cycle and current element 305 ($I_5$) is switched to the positive output of the DAC. Current elements 315, 320 and 325 are switched to negative output of the DAC.

Hence, error current when current element 305 is out of the reference amplifier loop $$= I_+ - I_- = \Delta I - 3\Delta I = -2\Delta I \qquad \text{Equation (5)}$$

Average error current when current element 305 is in the reference amplifier loop (since there are five current elements)

$$= -2\Delta I/5 \qquad \text{Equation (6)}$$

Net error in the rotation cycle=Equation (6)+Equation (4)

$$= (2\Delta I/5) + (-2\Delta I/5) = 0 \qquad \text{Equation (7)}$$

Figure 4:
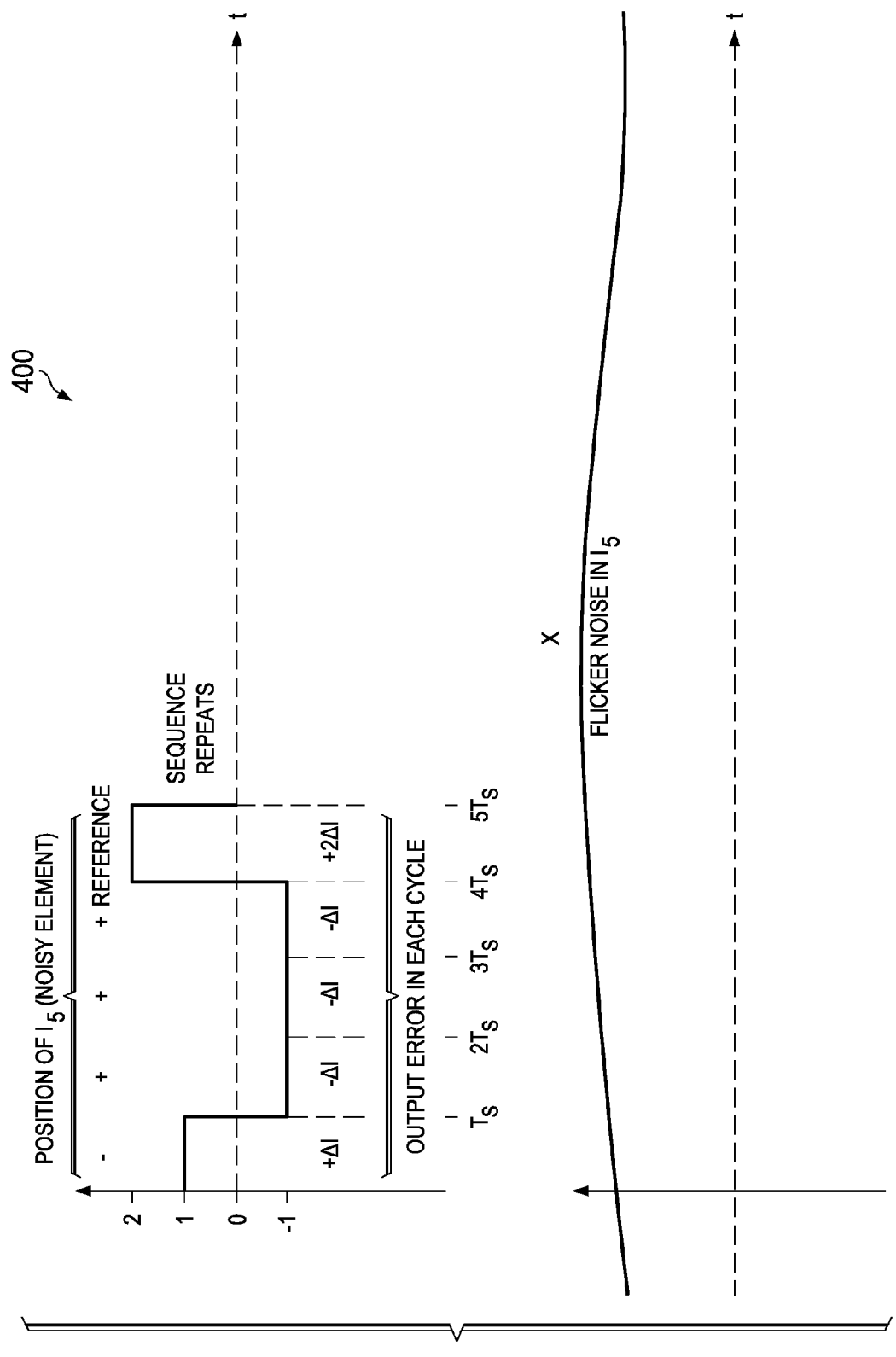
FIG. 4 illustrates the noise cancellation mechanism in time domain according to an embodiment.

As noted above, using the rotation mechanism according to an embodiment, the average error in the current elements of the DAC can be attenuated. The rotation mechanism is equivalent to multiplying the noise of the current elements with a periodic wave of frequency Fr=Fs/(N+K2), where K2 is the number of reference element and where Fs is the DAC rate (for example ~9.6 MHz). Multiplying the periodic wave with a flicker noise pushes the flicker noise to a frequency out of a signal band of interest. Multiplication with the periodic wave is illustrated in FIG. 4. Rotation mechanism also improves the signal to noise ratio (SNR) of the DAC. This is analogous to chopping where the audio band integrated flicker noise gets reduced by a factor [Ln(20e3/20)/Ln(Fr+20e3/Fr)] where Fr is the frequency of the periodic wave and Ln is the logarithm to the base 'e'. Since integrated flicker noise voltage is attenuated by a factor of 18 for Fr=1 MHz, the budget can be used to reduce the reference current by making the number of reference elements (down to 1 if thermal noise of the current elements permits) and increasing resistance of the reference resistor and further reducing reference amplifier and reference resistor noise contributions.

FIG. 4 illustrates the noise cancellation mechanism in time domain capturing the position of the current element 305 ($I_5$) which has an error of $\Delta I$. X axis of the graph denotes the switching instant and Y axis denotes sign and magnitude of the error that appears at the output of the DAC. Ts, 2Ts, 3Ts, 4Ts and 5Ts indicate the five switching instants in one rotation cycle. At switching instant Ts, current element 305 is switched to positive output creating an error of $\Delta I$ at the output of the DAC. At switching instances 2Ts, 3Ts and 4Ts, the current element 305 is switched to a negative output and error created at the output of the DAC is equal to $-3\Delta I$. At the switching instance 5Ts the current element 305 is in the reference amplifier loop which creates an error of $2\Delta I$ at the output of the DAC. The flicker noise curve as shown in the figure is the error $\Delta I$ in the current element 305 which is multiplied by the sign and magnitude of the error.

Figure 5:
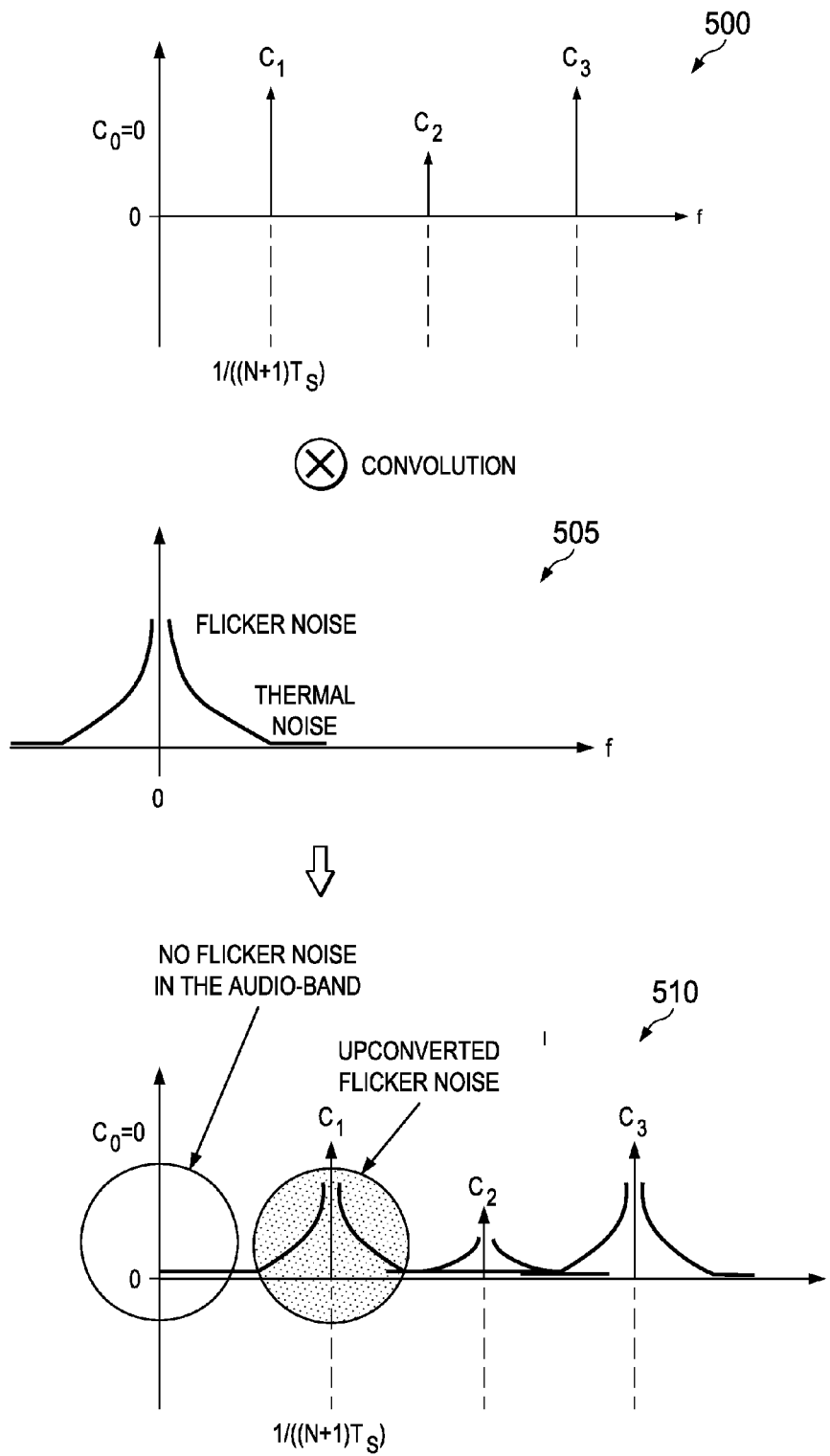
FIG. 5 illustrates the noise cancellation mechanism in frequency domain according to an embodiment.

FIG. 5 illustrates the noise cancellation mechanism in frequency domain according to an embodiment. In frequency domain the noise spectrum 505 of the current element in consideration is getting convolved by the Fourier series 500 of the periodic wave (400) as shown. The $C_0$ (DC component of the Fourier series coefficient) of the Fourier series is always zero irrespective of the data pattern. The other Fourier series coefficients ($C_1$, $C_2$ and $C_3$ as shown) change depending on the data pattern. This mechanism can be treated as an extension of chopping with the noise spectrum being modulated to a frequency=1/(N+1)Ts, where N is the number of current elements of the DAC and Ts is the switching instant of the DAC.

The result of convolution between the Fourier series and the noise spectrum is the resultant noise spectrum 510 which shows that there is no flicker noise in the audio band. The up converted flicker noise can be seen in FIG. 5 at the first harmonic of the rotating frequency with its magnitude scaled by $C_1$.

Figure 1:
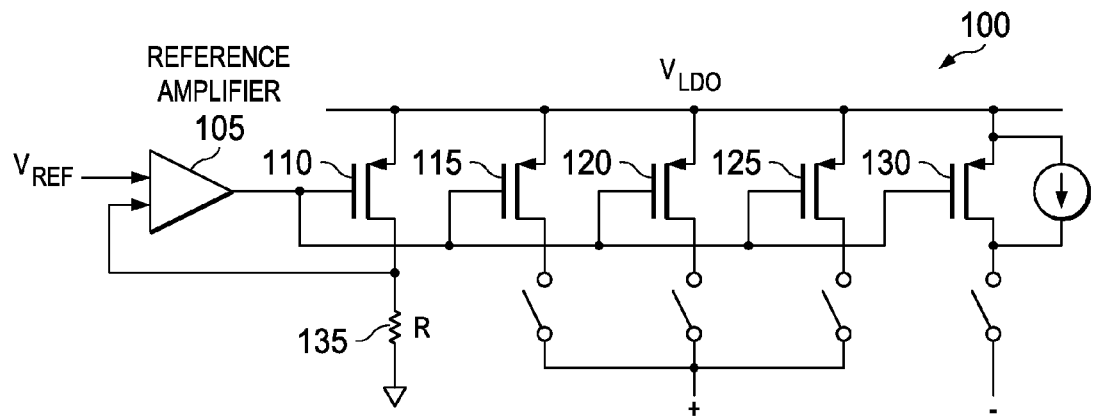
FIG. 1 illustrates a current steering DAC according to the prior art.
Figure 6:
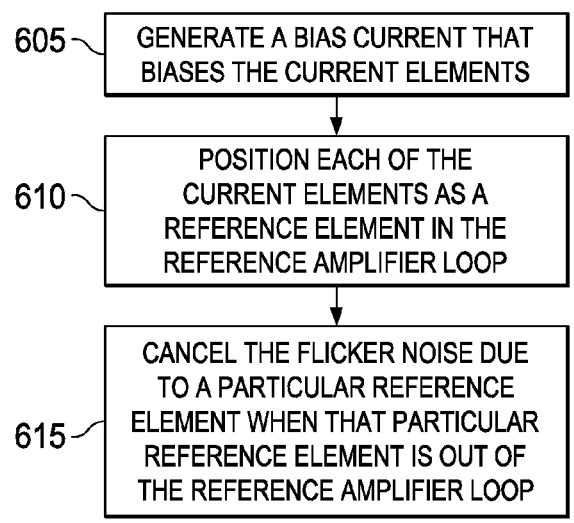
FIG. 6 is a flow diagram illustrating a method for reducing flicker noise in the DAC according to an embodiment.

FIG. 6 is a flow diagram illustrating a method for reducing flicker noise in the DAC according to an embodiment. At step 605, a bias current is generated. The bias current biases the set of current elements (for example the current elements 305-325). As explained before, a DAC includes a reference amplifier (205), the set of current elements which includes a reference element. At step 610, each of the set of current elements is positioned as a reference element in the reference amplifier loop. Each of the set of current elements including the reference element is periodically connected to the reference resistor and an output of the DAC respectively. The DAC logic (210) is used to control the switches (245-265) such that each of the set of current elements is in the reference amplifier loop at least once in a rotation cycle. In other words, the DAC logic rotates the set of current elements of the DAC along with the reference element. Due to this rotation, at step 615, the flicker noise created when a particular reference element is in the reference amplifier loop is cancelled when that particular reference element is out of the reference amplifier loop.

The flow diagram is provided merely by way of illustration, and other techniques, steps, and/or sequence of steps can also be implemented to reduce flicker noise in the DAC and the reference element without departing from the scope and spirit of several embodiments, as will be apparent to one skilled in the relevant arts by reading the disclosure herein.

Using various embodiments, flicker noise of a particular reference element and the current elements of the DAC is significantly reduced thereby saving power, especially for low noise products, the power consumption of the reference arm is considerably reduced. Implementation area of the DAC is also reduced. Various embodiments also push the flicker noise to a frequency out of a signal band of interest without raising the thermal noise floor. Various embodiments may find application in very low power, low noise and low area DAC designs n ultra deep sub-micron CMOS processes that includes high 1/f noise transistors, where integrating applications like audio applications is increasing in demand. Some examples of such implementation includes, but not limited to, signal processing and control circuits of a cellular phone, set top box, voice over internet protocol (VoIP) phone, and a media player.

In the foregoing discussion, the term "connected" means at least either a direct electrical connection between the devices connected or an indirect connection through one or more passive or active intermediary devices. The term "circuit" means at least either a single component or a multiplicity of components, either active or passive, that are connected together to provide a desired function. The term "signal" means at least one current, voltage, charge, data, or other signal.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A current steering digital-to-analog converter (DAC) comprising:
    a current reference for generating a bias current that biases a set of current elements, the set of current elements comprising a reference element, the current reference comprising a reference amplifier, and a reference arm comprising a reference resistor and the reference element; and
    a switch periodically coupling each current element including the reference element, to the reference resistor and an output of the current steering DAC, wherein periodic coupling causes rotation the set of current elements, thereby attenuating flicker noise from each current element of the set of current elements.

2. The current steering DAC of claim 1, wherein the switch positions each of the set of current elements as the reference element in the reference amplifier loop at least once in a rotation cycle, thereby canceling flicker noise created at the output due to a particular current element when the particular current element is out of the reference amplifier loop.

3. The current steering DAC of claim 2, wherein the switch selects each current element as the reference element at least once in the rotation cycle.

4. The current steering DAC of claim 2, wherein the switch rotates the reference element and the set of current elements in a cyclic fashion.

5. The current steering DAC of claim 2, wherein the set of current elements comprises a set of reference elements.

6. The current steering DAC of claim 1, wherein a DAC logic controls the switch.

7. The current steering DAC of claim 3, wherein the switch rotates the reference arm and the set of current elements that pushes the flicker noise of each of the current elements to a frequency out of a signal band of interest thereby improving the signal to noise ratio of the DAC.

8. A method for steering current in a digital-to-analog converter (DAC), comprising:
    generating a bias current that biases a set of current elements, the set of current elements comprising a reference element, the current reference comprising a reference amplifier, and a reference arm comprising a reference resistor and the reference element; and
    coupling, periodically, each current element including the reference element, to the reference resistor and an output of the current steering DAC respectively, for rotating the set of current elements, thereby attenuating noise from each current element.

9. The method of claim 8, wherein coupling comprises:
    positioning each current element as the reference element in the reference amplifier loop at least once in a rotation cycle; and
    cancelling the flicker noise created at the output due to a particular current element when the particular current element is out of the reference amplifier loop.

10. The method of claim 8, wherein coupling causes rotation of the set of current elements.

11. The method of claim 8, wherein attenuating the noise from each current element comprises attenuating flicker noise from each current element.

12. A system comprising:
    a current reference for generating a bias current that biases a set of current elements, the set of current elements comprising a reference element, the current reference comprising a reference amplifier, and a reference arm comprising a reference resistor and the reference element; and
    a logic that periodically selects each current element including the reference element and couples to the reference resistor and an output of the system, wherein the logic rotates the set of current elements that attenuates noise from each current element.

13. The system of claim 12, wherein the logic comprises a switch that couples each current element to the reference resistor and the output of the system.

14. The system of claim 12, wherein the logic selects each current element as the reference element at least once in the rotation cycle.

15. The system of claim 12, wherein the logic rotates the reference element and the set of current elements in a cyclic fashion.

16. The system of claim 12, wherein the set of current elements comprises a set of reference elements.

* * * * *